(12) United States Patent
Ito et al.

(10) Patent No.: US 11,677,312 B2
(45) Date of Patent: Jun. 13, 2023

(54) SEMICONDUCTOR DEVICE AND POWER CONVERTER

(71) Applicant: Mitsubishi Electric Corporation, Tokyo (JP)

(72) Inventors: Yusaku Ito, Tokyo (JP); Yusuke Nakamatsu, Tokyo (JP); Jun Tomisawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 424 days.

(21) Appl. No.: 16/963,283

(22) PCT Filed: Dec. 3, 2018

(86) PCT No.: PCT/JP2018/044375
§ 371 (c)(1),
(2) Date: Jul. 20, 2020

(87) PCT Pub. No.: WO2019/146258
PCT Pub. Date: Aug. 1, 2019

(65) Prior Publication Data
US 2021/0048472 A1    Feb. 18, 2021

(30) Foreign Application Priority Data

Jan. 26, 2018   (JP) .............................. JP2018-011384

(51) Int. Cl.
*H02M 1/32*       (2007.01)
*G01R 31/66*      (2020.01)
(Continued)

(52) U.S. Cl.
CPC .............. *H02M 1/32* (2013.01); *G01R 31/26* (2013.01); *G01R 31/66* (2020.01); *H01L 24/48* (2013.01);
(Continued)

(58) Field of Classification Search
CPC .... H02M 7/53871; H02M 1/32; G01R 31/66; G01R 31/26; H02P 27/08; H01L 24/48;
(Continued)

(56) References Cited

U.S. PATENT DOCUMENTS

2018/0123477 A1* 5/2018 Sakano ................... H02M 7/53
2020/0116780 A1* 4/2020 Kawahara .......... G01R 31/2621

FOREIGN PATENT DOCUMENTS

JP    2007-113983 A    5/2007
JP    2015-114149 A    6/2015

OTHER PUBLICATIONS

International Search Report and Written Opinion dated Jan. 29, 2019 for PCT/JP2018/044375 filed on Dec. 3, 2018, 7 pages including English Translation of the International Search Report.

* cited by examiner

*Primary Examiner* — Rafael O De Leon Domenech
(74) *Attorney, Agent, or Firm* — Xsensus LLP

(57) ABSTRACT

A semiconductor device improved in deterioration detection accuracy by using an inductance of a bonding wire. The semiconductor device includes a first conductor pattern formed on the insulating substrate, the main current of the semiconductor die device flowing through the first conductor pattern; a second conductor pattern formed on the insulating substrate for sensing the potential of the surface electrode of the semiconductor die device; a first bonding wire for connecting the surface electrode and the first conductor pattern; and a second bonding wire. Further, there is a voltage sensing unit which is connected to the first conductor pattern and the second conductor pattern to sense a potential difference between the first conductor pattern and the second conductor pattern at the time of switching of the semiconductor die device; and a deterioration detection unit (Continued)

for detecting deterioration of the first bonding wire by using the sensed potential difference.

20 Claims, 7 Drawing Sheets

(51) Int. Cl.
*G01R 31/26* (2020.01)
*H01L 23/00* (2006.01)
*H01L 25/07* (2006.01)
*H01L 25/18* (2023.01)
*H02M 7/5387* (2007.01)
*H02P 27/08* (2006.01)

(52) U.S. Cl.
CPC ............ *H01L 24/49* (2013.01); *H01L 25/072* (2013.01); *H01L 25/18* (2013.01); *H02M 7/53871* (2013.01); *H01L 2224/48137* (2013.01); *H01L 2224/48227* (2013.01); *H01L 2224/49111* (2013.01); *H01L 2224/49112* (2013.01); *H02P 27/08* (2013.01)

(58) Field of Classification Search
CPC ....... H01L 24/49; H01L 25/072; H01L 25/18; H01L 2224/48137; H01L 2224/48227; H01L 2224/49112
See application file for complete search history.

SEMICONDUCTOR DEVICE AND POWER CONVERTER

CROSS-REFERENCE TO RELATED APPLICATIONS

The present application is based on PCT filing PCT/JP2018/044375, filed Dec. 3, 2018, which claims priority to JP 2018-011384, filed Jan. 26, 2018, the entire contents of each are incorporated herein by reference.

TECHNICAL FIELD

The present disclosure relates to a semiconductor device having a deterioration detection function and a power converter including the semiconductor device.

BACKGROUND ART

A semiconductor device usually includes: a substrate having a conductor pattern; a semiconductor die device having its bottom side bonded to the conductor pattern and its top side with a surface electrode thereon; and a bonding wire with its one end bonded to the surface electrode and the other end thereof bonded to the conductor pattern on the substrate. The bonding wire is deteriorated by repeated temperature changes during operation of the semiconductor module.

Then, a disclosure says that one way in a conventional semiconductor device is to measure a voltage between two ends, which are a Kelvin emitter electrode and a sensing electrode, on a die under the condition where DC current flows constantly through a semiconductor die by using a specific sensing bonding wire, and the deterioration of the bonding wire is detected by using the fact that the voltage changes when the sensing bonding wire is detached from the die by deterioration compared with that when it is not yet deteriorated, for example, in Patent Document 1.

Another way is to detect the deterioration of a bonding wire by the voltage change between both ends of the deteriorated bonding wire under the condition where DC current flows constantly through the semiconductor die device without requiring no specific sensing bonding wire, which is disclosed in, for example, Patent Document 2.

REFERENCES CITED

Patent Documents

Patent Document 1: Unexamined Patent Application Publication JP, 2015-114149, A
Patent Document 2: Unexamined Patent Application Publication JP, 2007-113983, A

SUMMARY OF THE INVENTION

Problems to be Solved by the Invention

However, since the deterioration of the bonding wire is detected by a change of the resistance of the bonding wire in conventional semiconductor devices, the current passing through the bonding wire should be large in order to improve the detection accuracy of the deterioration by increasing the change of the voltage at the time of deterioration compared to that when it is not deteriorated. In addition, when the current increases, the voltage drop increases only by a value proportional to the increase of the current, which is a problem.

The present disclosure is made in order to solve the above-mentioned problems. It is an object of the disclosure to provide a semiconductor device with a function to detect the deterioration of a bonding wire without requiring a specific sensing bonding wire and without requiring the increase of the current passing through the semiconductor die device.

Solutions to the Problems

The semiconductor device includes: an insulating substrate; a semiconductor die device attached on the insulating substrate and having a surface electrode on the top side thereof; a first conductor pattern formed on the insulating substrate, the main current of the semiconductor die device flowing through the first conductor pattern; a second conductor pattern formed on the insulating substrate to sense the potential of the surface electrode of the semiconductor die device; a first bonding wire to connect the surface electrode and the first conductor pattern; a second bonding wire to connect the surface electrode and the second conductor pattern; a voltage sensing unit which is connected to the first conductor pattern and the second conductor pattern to sense a potential difference between the first conductor pattern and the second conductor pattern at the time of switching of the semiconductor die device; and a deterioration detection unit to detect deterioration of the first bonding wire by using the sensed potential difference.

Advantageous Effects of the Invention

According to the semiconductor device of the present disclosure, the detection accuracy of the deterioration of the bonding wire can be improved.

EMBODIMENTS

Figure 1:
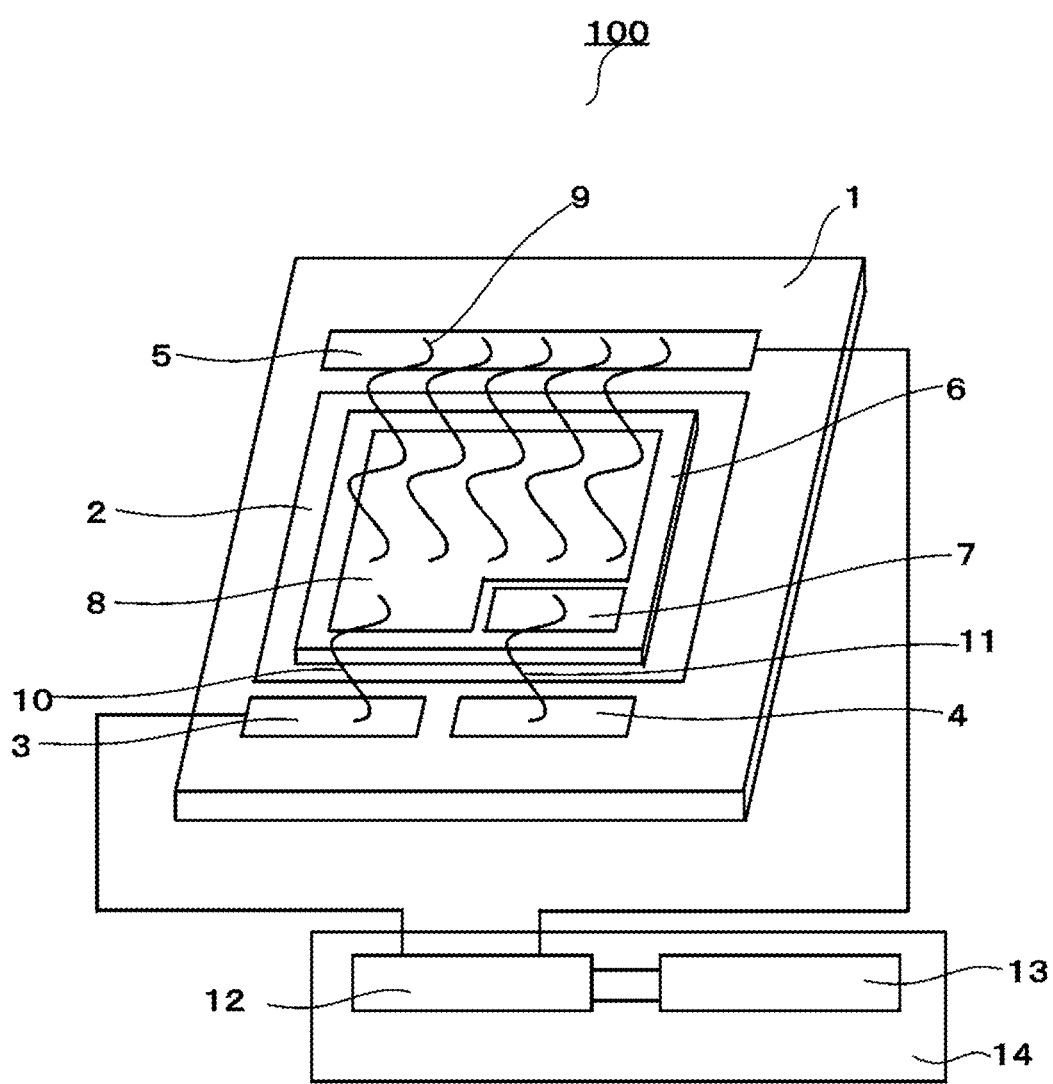
FIG. 1 is a schematic diagram of the structure of a semiconductor device according to Embodiment 1 of the present disclosure.

Embodiments are described below referring to the drawings. The equivalent or corresponding parts through the drawings are each denoted by their common reference signs.

Possible optional combinations of parts of Embodiments described below also compose the present disclosure.

Embodiment 1

The structure of a semiconductor device according to Embodiment 1 of the present disclosure is described below.

FIG. 1 is a schematic diagram of the structure of the semiconductor device according to Embodiment 1 of the present disclosure. In FIG. 1, a semiconductor device 100 includes an insulating substrate 1, a conductor pattern 2, a conductor pattern 3 as the second conductor pattern, a conductor pattern 4, a conductor pattern 5 as the first conductor pattern, a semiconductor die 6, a gate electrode 7, a surface electrode 8 of the semiconductor die 6, a bonding wire 9 as the first bonding wire, a bonding wire 10 as the second bonding wire, a bonding wire 11, a voltage sensing unit 12 for sensing a potential difference between the conductor pattern 3 and the conductor pattern 5, and a deterioration detection unit 13 for detecting deterioration of the first bonding wire.

A deterioration detection device 14 includes the voltage sensing unit 12 for sensing a potential difference between the conductor pattern 3 and the conductor pattern 5 and the deterioration detection unit 13 for determining the deterioration of the bonding wire 9 from the potential difference sensed by the voltage sensing unit 12. The deterioration detection device 14 may be built in the semiconductor device 100, for example, on the insulating substrate 1, or the deterioration detection device 14 may be provided outside the semiconductor device 100.

Possible materials for the insulating substrate 1 are, for example, alumina (Al2O3), aluminum nitride (AlN), or the like. The conductor patterns 2, 3, 4 and 5 are formed on the top face of the insulating substrate 1.

Possible material for the conductor patterns 2, 3, 4, 5, the gate electrode 7, and the surface electrode 8 of the semiconductor die 6 device is, for example, copper (Cu) or aluminum (Al). The conductor pattern 2 is connected to the bottom face of the semiconductor die 6 device. The conductor pattern 3 is connected to the surface electrode 8 of the semiconductor die 6 device via the bonding wire 10. The conductor pattern 3 is used to sense the potential of the surface electrode 8 of the semiconductor die 6 device. The conductor pattern 4 is connected to the gate electrode 7 of the semiconductor die 6 device via the bonding wire 11. The conductor pattern 5 is connected to the surface electrode 8 of the semiconductor die 6 device via the bonding wire 9. Main current of the semiconductor die 6 device flows through the conductor pattern 5.

The semiconductor die 6 device is, for example, a power semiconductor device with a vertical structure where the current flows from the bottom side to the top side thereof. The semiconductor die 6 device is made of, for example, a single crystal of silicon (Si). However, the semiconductor material candidate for the semiconductor die 6 device is not limited to this. It may be a semiconductor material with a wide band gap such as silicon carbide (SiC) and gallium nitride (GaN), for example.

Possible materials for the bonding wires 9, 10 and 11 are, for example, gold (Au), copper (Cu), aluminum (Al), or the like. Each of the bonding wires 9, 10 and 11 is bonded to appropriate ones among the conductor patterns 3, 4, 5, the surface electrode 8, and the gate electrode 7 by ultrasonic bonding, for example.

The bonding wire 9 connects the surface electrode 8 of the semiconductor die 6 device and the conductor pattern 5. A plurality of bonding wires 9 can be used. The bonding wire 10 connects the surface electrode 8 of the semiconductor die 6 device and the conductor pattern 3. Since the bonding wire 10 is for sensing the potential of the surface electrode 8 of the semiconductor die 6 device, a bonding wire whose diameter is smaller than the bonding wire 9 can be used for the bonding wire 10. The bonding wire 11 connects the gate electrode 7 of the semiconductor die 6 device and the conductor pattern 4.

Figure 2:
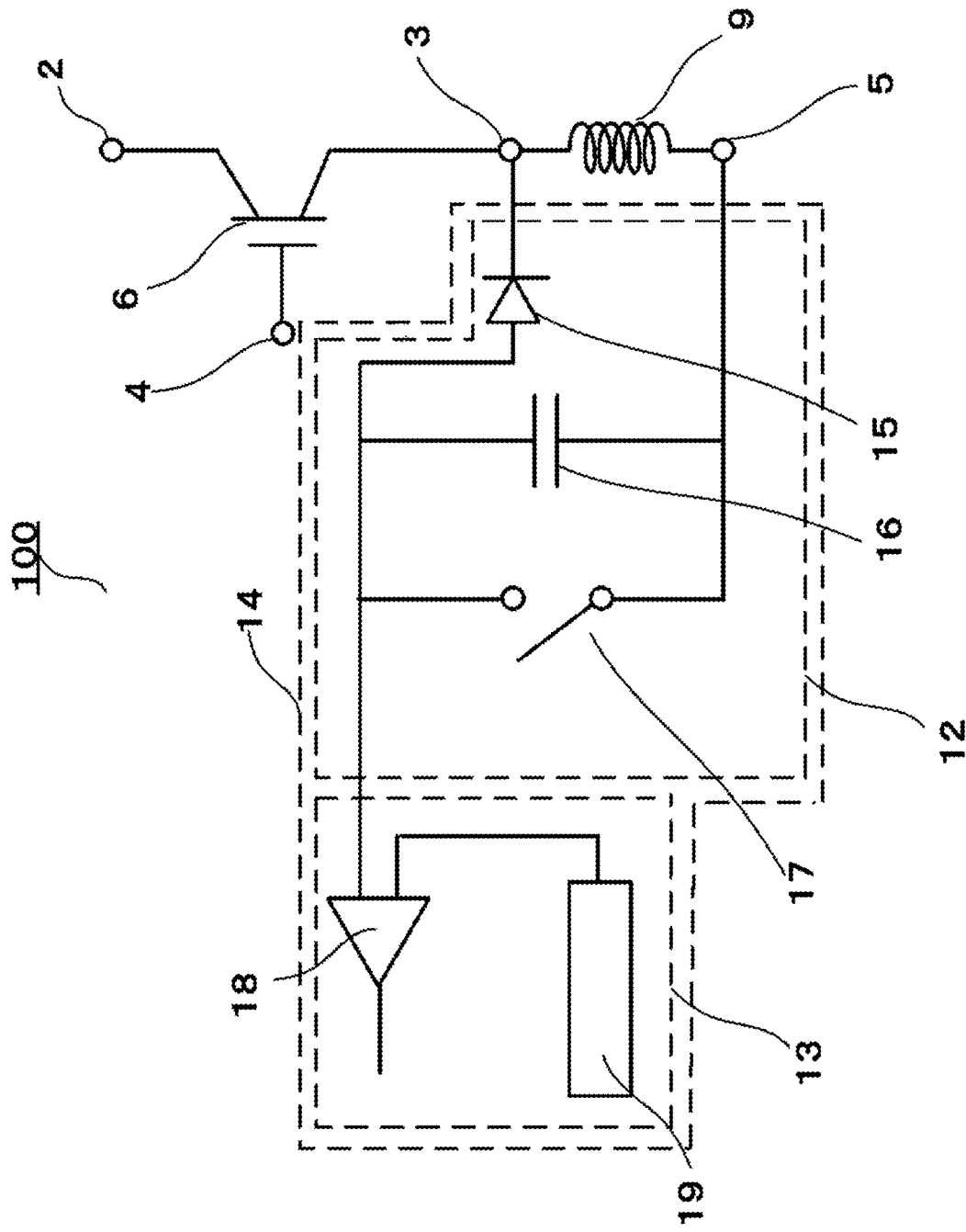
FIG. 2 is a circuit diagram of the semiconductor device according to Embodiment 1 of the present disclosure.

FIG. 2 is a circuit diagram of the semiconductor device according to Embodiment 1 of the present disclosure. FIG. 2 shows a circuit diagram which is a possible embodiment of the voltage sensing unit 12 and the deterioration detection unit 13. As shown in FIG. 2, the voltage sensing unit 12 includes a diode 15, a capacitor 16, and a switch 17. The deterioration detection unit 13 includes a comparator 18 for comparing voltages and a reference voltage generator 19 for generating a reference voltage.

The voltage sensing at the time of switching of the semiconductor die 6 device is classified into those at, to be more specific, three points in time, which are each at the time of its switching on, its switching off, and its switching-on recovery current flowing. Although FIG. 2 shows a circuit configuration corresponding to the detection of deterioration when the semiconductor die 6 device is switched off, the detection of deterioration of the bonding wire can be performed even when the semiconductor die 6 device is switched on by reversing the connections of the diode 15 and the comparator 18. Even with the circuit configuration shown in FIG. 2, the voltage at the time of the flow of the switching-on recovery current can be detected, so that the deterioration of the bonding wire 9 can be detected by monitoring the voltage at the time of the recovery current flow. This circuit configuration makes it possible to accurately detect general types of deterioration of a bonding wire such as a case where a bonding wire is broken off from the semiconductor die device by the development of a crack near the interface between the bonding wire and the surface electrode and a case where a developing crack in a bonding wire at its bend causes the bonding wire's half-way cut off.

The diode 15 has a first end connected to the conductor pattern 3 and a second end connected to the comparator 18. A first end of the capacitor 16 is connected to the second end of the diode 15, and a second end of the capacitor 16 is connected to the conductor pattern 5. One end of the switch 17 is connected to the second end of the diode 15 and the other end of the switch 17 is connected to the conductor pattern 5 so as for the switch 17 to be connected in parallel with the capacitor 16. The output of the voltage sensing unit 12 and the output of the reference voltage generator 19 enter the comparator 18. As the switch 17, for example, a semiconductor device can be used.

Referring to FIGS. 1 and 2, the procedure of the voltage sensing and the deterioration detection at the time of the semiconductor die 6 device's switching off is described.

First, when the semiconductor die 6 device is in its ON state, the current flows in the semiconductor die 6 device from the bottom side of the semiconductor die 6 device to the top side thereof, in other words, along the vertical direction from the conductor pattern 2 to the surface electrode 8 of the semiconductor die 6 device. At this time, the switch 17 of the voltage sensing unit 12 is in its OFF state. The surface electrode 8 of the semiconductor die 6 device is connected to the conductor pattern 3 on the insulating substrate 1 via the bonding wire 10. Hence the potential of the conductor pattern 3 is equal to that of the surface electrode 8 of the semiconductor die 6 device.

Next, the current which flows from the conductor pattern 2 to the surface electrode 8 of the semiconductor die 6 device flows to the conductor pattern 5 on the insulating substrate 1 via the bonding wires 9 connected to the surface electrode 8 of the semiconductor die 6 device. Since a bonding wire 9 has its resistance and its inductance, it has a potential difference between its both ends which is represented by the sum of the potential difference by the resistance, which is represented by the product of the resistance and the current, and the potential difference by the inductance, which is represented by the product of the inductance and the time derivative of the current.

One end of a bonding wire 9 has the same potential as the conductor pattern 3 formed on the insulating substrate 1, and the other end as the conductor pattern 5 formed thereon. Hence in FIG. 2, there is a potential difference, which is represented by the sum of the potential difference due to the resistance of the bonding wires 9 and the potential difference due to the inductance of the bonding wires 9, between the conductor pattern 3 and the conductor pattern 5 formed on the insulating substrate 1.

At the moment the current is flowing constantly (ON state), the time derivative of the current is zero, hence the potential difference due to the inductance is zero. The potential difference due to the resistance is also small, since the resistance of the bonding wires 9 is small.

When the semiconductor die 6 device is switched off (turned into its OFF state) from this state (ON state), the current flowing through the semiconductor die 6 device decreases rapidly and the current flowing through the bonding wires 9 similarly decreases. At this time, a potential difference which is represented by the product of the inductance of the bonding wires 9 and the time derivative of the current is induced between the conductor pattern 3 and the conductor pattern 5.

Although the potential difference due to the resistance of the bonding wires 9 also exists at the same time, the resistance of the bonding wires 9 is generally small. Therefore, the potential difference due to the resistance is negligible in comparison with the potential difference due to the inductance.

The conductor pattern 3 is connected to the surface electrode 8 by the bonding wire 10 and hence it has the same potential as that of the surface electrode 8. Since the current flowing in the "positive" direction, which means here a direction going from the surface electrode 8 to the conductor pattern 5, during the ON state time of the semiconductor die 6 device decreases, the potential of the conductor pattern 5 becomes higher than that of the conductor pattern 3 due to the inductance of the bonding wires 9 concerning the voltage between the conductor pattern 3 and the conductor pattern 5, which are formed on the insulating substrate 1. In general, the absolute value of the time derivative of the current is not constant during the time of switching off. It has its maximum peak at a certain point of time in the duration.

As shown in FIG. 2, one end of the capacitor 16 is connected to the conductor pattern 3 side, and the other end thereof is connected to the conductor pattern 5 side.

The switch 17 is in its OFF state, and the electric charge corresponding to the induced voltage which is due to the inductance of the bonding wires 9 and which is between the conductor pattern 3 and the conductor pattern 5 accumulates at the capacitor 16 at the time of the semiconductor die 6 device's switching off. The diode 15 is provided between one end of the capacitor 16 and the conductor pattern 3, and the maximum voltage appeared at the capacitor 16 is kept between both ends of the capacitor 16. This voltage kept at the capacitor 16 comes from the maximum voltage appeared between both ends of the bonding wires 9 due to the inductance of the bonding wires 9.

One end of the capacitor 16 is connected to the input side of the comparator 18. The comparator 18 compares the voltage kept at the capacitor 16 with the reference voltage from the reference voltage generator 19 for determining the deterioration. When the voltage kept at the capacitor 16 exceeds the reference voltage, it determines that one or some of the bonding wires 9 are deteriorated and gives an output of error signal showing the deterioration.

Since it is possible to make the time derivative of the current at the time of the semiconductor die 6 device's switching off be constant under the same switching condition, the voltage between the conductor pattern 3 and the conductor pattern 5 monotonously increases due to the deterioration of the bonding wires 9. This is because of the increase of the inductance of the bonding wires 9 due to the deterioration of the bonding wires 9.

Then, by setting the reference voltage for determining the deterioration in advance, it is possible to determine the deterioration at the moment the peak value of the potential difference between the conductor pattern 3 and the conductor pattern 5 at the time of the semiconductor die 6 device's switching off exceeds the reference voltage. Although it is possible to use only one reference voltage value, it is also possible to make the determination possible for variety of switching-off operations of the semiconductor die 6 device by preparing the reference voltage values obtained under various conditions, such as that obtained by changing the temperature, that obtained by changing the ON state current of the semiconductor die 6 device, that obtained by changing the gate resistance, and the like.

Another possible way is to use a CPU with a built-in memory to store the voltage of the capacitor 16 instead of using the comparator 18. In this case, the first step may be, for example, the acquisition of the peak value of the potential difference at the time of the semiconductor die 6 device's switching off under a certain condition followed by the second and later steps, which may be the turning on of the switch 17 to reset the potential difference between both ends of the capacitor 16 to zero and the second time acquisition of the peak value of the potential difference at the time of switching off under a second condition. These steps give the peak values of the potential difference at the time of switching off obtained under a plurality of conditions as values for comparison, and it is possible to comprehensively determine the deterioration of the bonding wires 9 by comparing these comparison values with the reference voltage.

Another possible way is to use a current sensor for monitoring the current during the time of switching off and a voltage sensor which is able to continuously monitor the potential difference between the conductor pattern 3 and the conductor pattern 5. In this way, the time derivative of the current and the potential difference between the conductor pattern 3 and the conductor pattern 5 are continuously monitored, and by dividing the potential difference between the conductor pattern 3 and the conductor pattern 5 by the time derivative of the current, the inductance of the bonding wires 9 can be obtained. The deterioration can be detected from the change of this obtained inductance.

Since the potential difference between the conductor pattern 3 and the conductor pattern 5 at the time of switching of the semiconductor die 6 device is sensed by the voltage sensing unit 12 connected to the conductor pattern 3 and the conductor pattern 5 in the semiconductor device 100 with above described configuration, the detection accuracy of the deterioration of the bonding wire 9 can be improved. Since this configuration is adopted, it is possible to easily make the change of the voltage between both ends of the bonding wires 9 large in case of the deterioration of a bonding wire 9 just by making the time derivative of the current during the switching large, instead of making the current flow through the bonding wires 9 large. This makes it possible to improve the detection accuracy of the deterioration. This is a use of the fact that when the magnitude of the current flowing through an object changes with time, the potential difference between both ends of the object is represented by the product of the time derivative of the current and the inductance of the object.

Since there is no need to increase the current in this configuration, it is possible to keep the temperature rise of the semiconductor die 6 device due to the heat generation in the semiconductor die 6 device small. In addition, in the comparison of the voltage change due to the resistance with the voltage change due to the inductance for deteriorated and non-deteriorated bonding wires 9 under the condition of common maximum current, it is easy for the voltage change due to the inductance to be made larger than the voltage change due to the resistance. Then, by using the voltage change due to the inductance, the detection accuracy of the deterioration of the bonding wire 9 by the change of the voltage can be improved.

Embodiment 2

The structure of a semiconductor device according to Embodiment 2 of the present disclosure is described below.

Embodiment 2 differs from Embodiment 1 in that a plurality of the semiconductor die 6 devices, each of which is the same as that in Embodiment 1, are connected in parallel to the conductor pattern 5. Even in a configuration with a plurality of the semiconductor die 6 devices connected in parallel like this, the detection accuracy of the deterioration of the bonding wire 9 can be improved. The other features of the configuration are the same as those of Embodiment 1, so that the detailed description is omitted.

Figure 3:
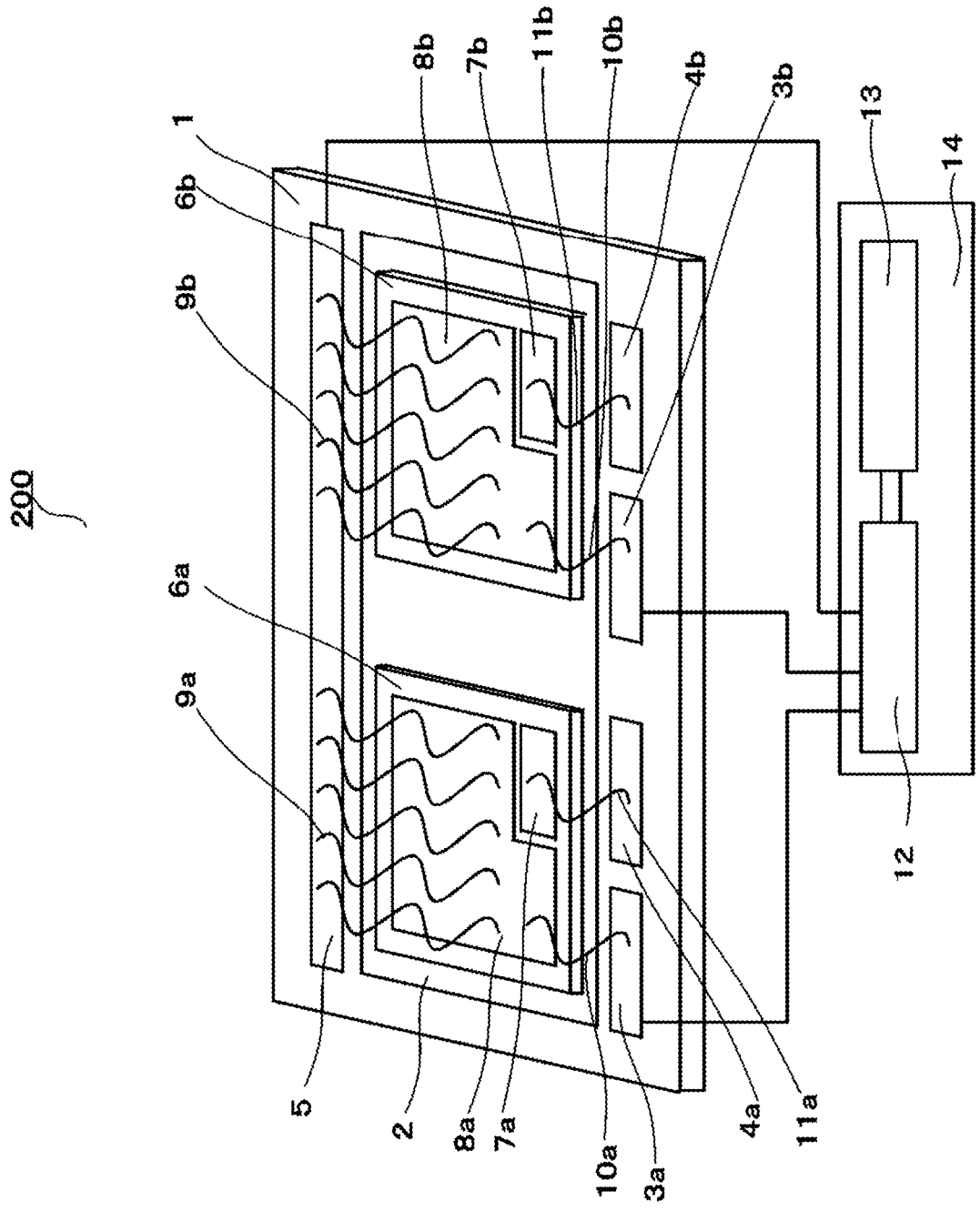
FIG. 3 is a schematic diagram of the structure of a semiconductor device according to Embodiment 2 of the present disclosure.

FIG. 3 is a schematic diagram of the structure of the semiconductor device according to Embodiment 2 of the present disclosure. In FIG. 3, the semiconductor device 200 includes an insulating substrate 1, a conductor pattern 2, conductor patterns 3a and 3b (, which is also called a conductor pattern 3 as a whole below, which is the same for other components with reference sign suffixes a, b) as the second conductor patterns, conductor patterns 4a and 4b, a conductor pattern 5 as the first conductor pattern, semiconductor dice 6a and 6b, gate electrodes 7a and 7b, surface electrodes 8a and 8b of the semiconductor die 6, bonding wires 9a and 9b as the first bonding wires, bonding wires 10a and 10b as the second bonding wires, bonding wires 11a and 11b, a voltage sensing unit 12 for sensing a potential difference between the conductor pattern 3 and the conductor pattern 5, and a deterioration detection unit 13 for detecting deterioration of the bonding wire 9.

A deterioration detection device 14 includes the voltage sensing unit 12 for sensing potential differences between the conductor patterns 3a, 3b and the conductor pattern 5 and the deterioration detection unit 13 for determining the deterioration of the bonding wires 9a, 9b from the potential differences sensed by the voltage sensing unit 12.

As shown in FIG. 3, in Embodiment 2, a plurality of the semiconductor die 6 devices are disposed in parallel to the conductor pattern 5, so that components other than those for common use are provided according to the number of the semiconductor die 6 devices.

Then, the semiconductor die 6a device and the semiconductor die 6b device are connected in electrically parallel, and by sensing each of the potential difference between the conductor pattern 3a and the conductor pattern 5 and the potential difference between the conductor pattern 3b and the conductor pattern 5 by the voltage sensing unit 12 for the deterioration detection unit 13 to determine the deterioration, it is possible detect the deterioration of either the bonding wire 9a or the bonding wire 9b. Concerning the conductor pattern 5, it is possible for one part thereof to which the bonding wires 9a are connect to be electrically isolated with the other part thereof to which the bonding wires 9b are connected and it is possible for those individually isolated parts of the conductor pattern 5 to be connected to the voltage sensing unit 12 each. In this case, the deterioration of each of the bonding wires 9a and 9b can be detected separately.

Since the potential differences between the conductor patterns 3a, 3b and the conductor pattern 5 at the time of switching of the semiconductor die 6 devices are sensed by the voltage sensing unit 12 connected to the conductor patterns 3a, 3b and the conductor pattern 5 in the semiconductor device 200 with above described configuration, the detection accuracy of the deterioration of the bonding wires 9a and 9b can be improved. Since this configuration is adopted, it is possible to easily make the changes of the voltages between both ends of the bonding wires 9a and between both ends of the bonding wires 9b large in case of the deterioration of a bonding wire 9a and a bonding wire 9b just by making the time derivative of the current during the switching large, instead of making the current flow through the bonding wires 9a and the current flow through the bonding wires 9b large. This makes it possible to improve the detection accuracy of the deterioration. This is a use of the fact that when the magnitude of the current flowing through an object changes with time, the potential difference between both ends of the object is represented by the product of the time derivative of the current and the inductance of the object.

In addition, even in a case where a plurality of semiconductor die 6 devices are connected in parallel, the detection accuracy of the deterioration of the bonding wires 9a and 9b can be improved.

Embodiment 3

The structure of a semiconductor device according to Embodiment 3 of the present disclosure is described below.

Embodiment 3 differs from Embodiment 1 in that semiconductor die 6 device, which is the same as that in Embodiment 1, and a second semiconductor die 20 device and the conductor pattern 5 are connected in series. In a configuration where a plurality of semiconductor die devices are connected in series using the semiconductor die 6 device with the second semiconductor die 20 device like this, the detection accuracy of the deterioration of the bonding wire 9 can also be improved. The other features of the configuration are the same as those of Embodiment 1, so that the detailed description is omitted.

Figure 4:
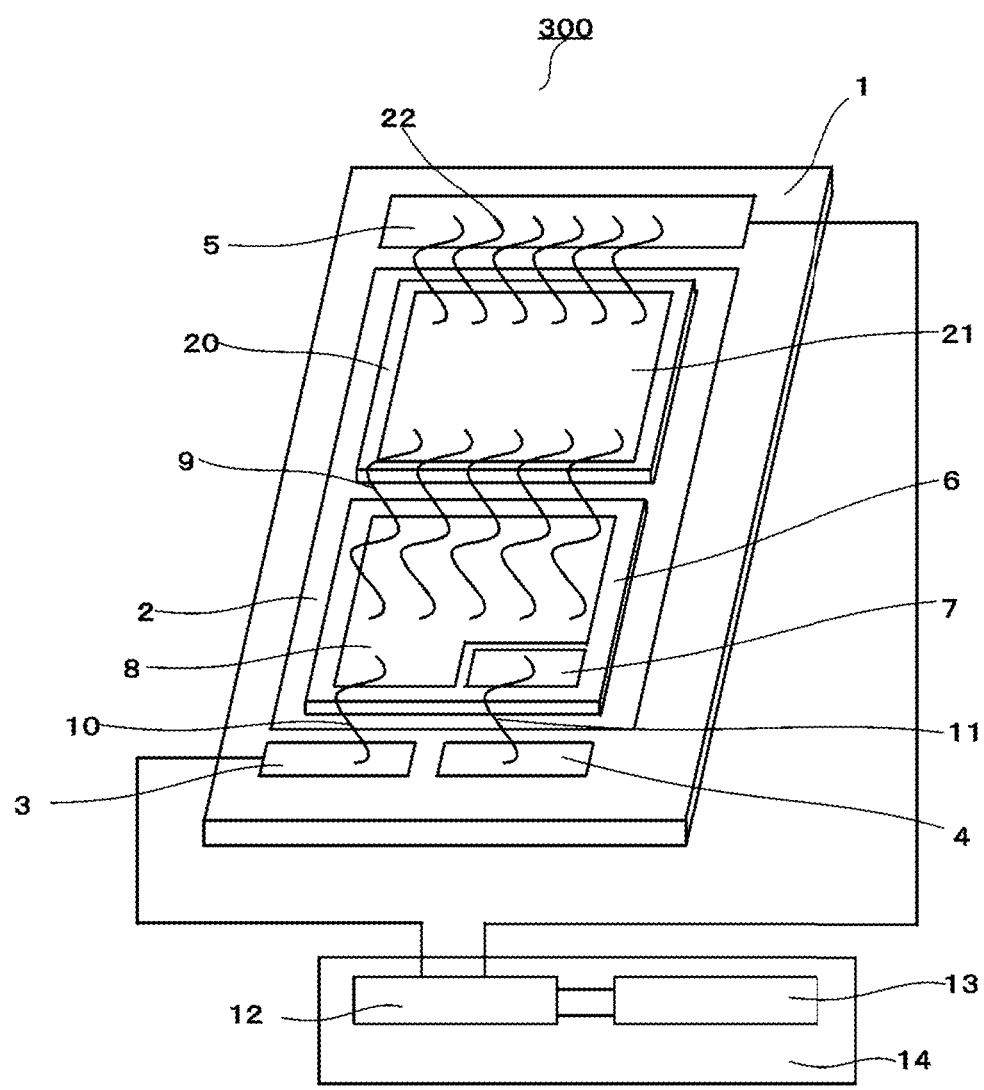
FIG. 4 is a schematic diagram of the structure of a semiconductor device according to Embodiment 3 of the present disclosure.

FIG. 4 is a schematic diagram of the structure of the semiconductor device according to Embodiment 3 of the present disclosure. In FIG. 4, a semiconductor device 300 includes an insulating substrate 1, a conductor pattern 2, a conductor pattern 3 as the second conductor pattern, a conductor pattern 4, a conductor pattern 5 as the first conductor pattern, semiconductor dice 6 and 20, a gate electrode 7, a surface electrode 8 of the semiconductor die 6, a surface electrode 21 of the semiconductor die 20, a bonding wire 9 as the first bonding wire, a bonding wire 10 as the second bonding wire, a bonding wire 11, a bonding wire 22 as the third bonding wire, a voltage sensing unit 12 for sensing a potential difference between the conductor pattern 3 and the conductor pattern 5, and a deterioration detection unit 13 for detecting deterioration of the bonding wire 9.

A deterioration detection device 14 includes the voltage sensing unit 12 for sensing a potential difference between the conductor pattern 3 and the conductor pattern 5 and the deterioration detection unit 13 for determining the deterioration of the bonding wire 9 from the potential difference sensed by the voltage sensing unit 12.

The semiconductor die 20 device is, for example, a rectifying device such as a Schottky barrier diode. The semiconductor die 20 device is made of, for example, a single crystal of silicon (Si). However, the semiconductor material candidate for the semiconductor die 20 device is not limited to this. It may be a semiconductor material with a wide band gap such as silicon carbide (SiC) and gallium nitride (GaN), for example.

Possible materials for the bonding wire 22 is, for example, gold (Au), copper (Cu), aluminum (Al), or the like. Possible material for the surface electrode 21 is, for example, copper (Cu), aluminum (Al), or the like.

As shown in FIG. 4, the surface electrode 8 of the semiconductor die 6 device is electrically connected to the conductor pattern 5 via the bonding wires 9, the surface electrode 21 of the semiconductor die 20 device, and the bonding wires 22. In this way, the semiconductor die 6 device and the semiconductor die 20 device are connected in series.

Deterioration of a bonding wire 9 and a bonding wire 22 can be detected by sensing, at the time of switching off, a potential difference between the conductor pattern 3 and the conductor pattern 5 due to the inductance of the bonding wires 9 and the bonding wires 22. Concerning the configuration of the semiconductor die 6 devices on the insulating substrate 1 in case of parallel connection shown in Embodiment 2, the same result can be obtained by connecting semiconductor die 20 devices in series to the semiconductor die 6 devices one by one.

Since the potential difference between the conductor pattern 3 and the conductor pattern 5 at the time of switching of the semiconductor die 6 device is sensed by the voltage sensing unit 12 connected to the conductor pattern 3 and the conductor pattern 5 in the semiconductor device 300 with above described configuration, the detection accuracy of the deterioration of the bonding wire 9 and the bonding wire 22 can be improved. Since this configuration is adopted, it is possible to easily make the change of the potential difference between both ends of a set of the bonding wires 9 and 22 large in case of the deterioration of a bonding wire 9 or a bonding wire 22 just by making the time derivative of the current during the switching large, instead of making the current flow through the bonding wires 9 and 22 large. This makes it possible to improve the detection accuracy of the deterioration. This is a use of the fact that when the magnitude of the current flowing through an object changes with time, the potential difference between both ends of the object is represented by the product of the time derivative of the current and the inductance of the object.

Since there is no need to increase the current in this configuration, it is possible to keep the temperature rise of the semiconductor die 6 device due to the heat generation in the semiconductor die 6 device small.

Embodiment 4

The structure of a semiconductor device according to Embodiment 4 of the present disclosure is described below.

In Embodiments 1 to 3, it is assumed that the time derivative of the current at the time of the semiconductor die 6 device's switching for detecting the deterioration of the bonding wire is almost constant regardless of the deterioration of the bonding wire 9. In fact, when the switching-off tests are conducted with deteriorated bonding wires 9, for example, in IGBTs as the semiconductor die 6 devices, the time derivatives of the currents do not change.

Concerning the switching-on tests with deteriorated bonding wires 9, for example, in IGBTs as the semiconductor die 6 devices, however, it is observed that the time derivatives of the currents slightly change between the tests with non-deteriorated bonding wires 9 and the tests with deteriorated bonding wires 9 even with common conditions such as a fixed gate resistance and a fixed temperature. Hence the potential difference to be sensed will change when the time derivative of the current changes even though the inductance is not changed.

Then, one possible way is to perform a fine adjustment of the switching condition between a case with the non-deteriorated bonding wires 9 and a case with a deteriorated bonding wire 9 to eliminate the influence of the change of the time derivative of the current, which makes it possible for the change of the inductance due to the deterioration of the bonding wire 9 to purely affect the potential difference, so that the detection accuracy of the deterioration will be improved. However, there is another way to improve the detection accuracy of the deterioration with no requirement of such a fine adjustment, which is presented here as Embodiment 4 below.

Embodiment 4 differs from Embodiment 1 in that a conductor pattern 23 is connected in series to the semiconductor die 6 device, which is the same as that in Embodiment 1, to sense a potential difference between the conductor pattern 3 and the conductor pattern 23 and a potential difference between the conductor pattern 23 and the conductor pattern 5 at the time of the semiconductor die 6 device's switching. Even in a configuration in which the conductor pattern 23 and the semiconductor die 6 device is connected in series like this, the detection accuracy of the deterioration of the bonding wire 9 can also be improved. The other features of the configuration are the same as those of Embodiment 1, so that the detailed description is omitted.

Figure 5:
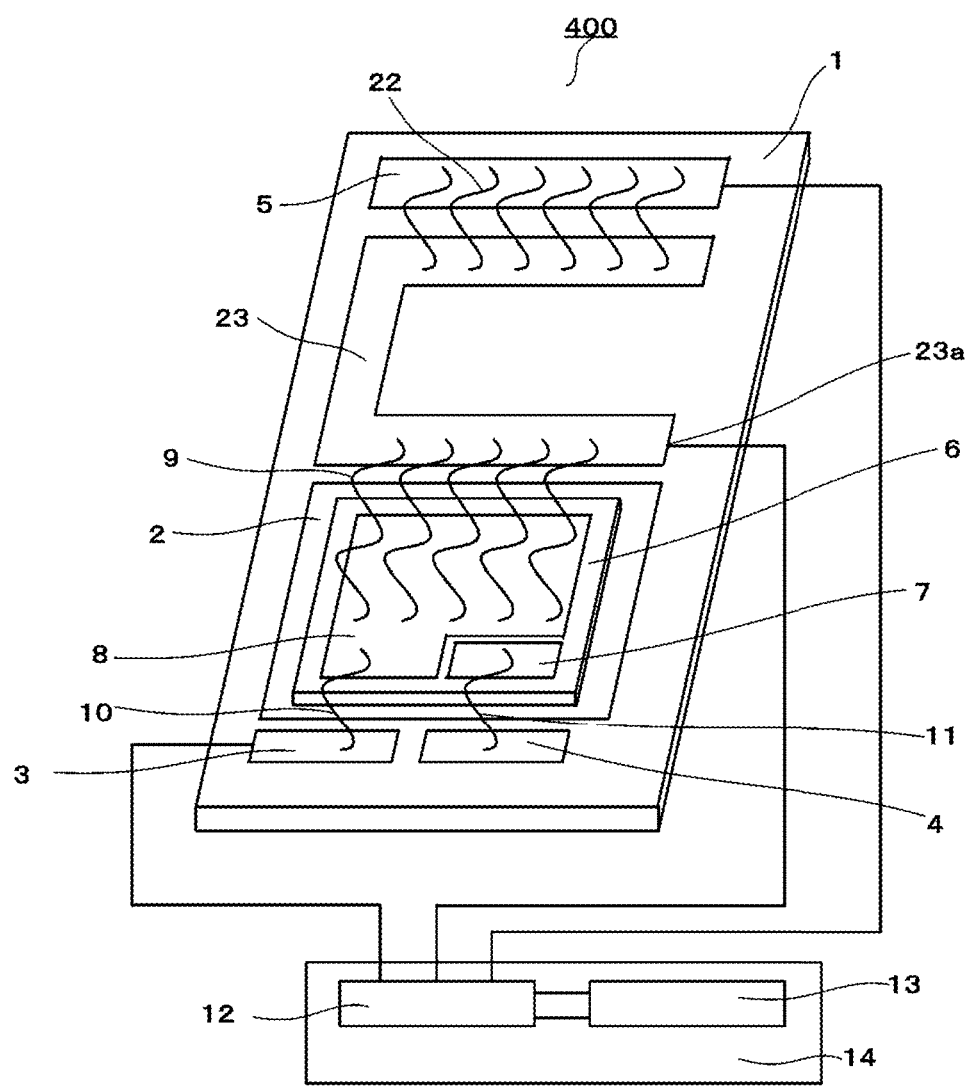
FIG. 5 is a schematic diagram of the structure of a semiconductor device according to Embodiment 4 of the present disclosure.

FIG. 5 is a schematic diagram of the structure of the semiconductor device according to Embodiment 4 of the present disclosure. In FIG. 5, the semiconductor device 400 includes an insulating substrate 1, a conductor pattern 2, a conductor pattern 3 as the second conductor pattern, a conductor pattern 4, a conductor pattern 5 as the first conductor pattern, a conductor pattern 23 as the third conductor pattern, a semiconductor die 6, a gate electrode 7, a surface electrode 8 of the semiconductor die 6, a bonding wire 9 as the first bonding wire, a bonding wire 10 as the second bonding wire, a bonding wire 11, a bonding wire 22 as the third bonding wire, a voltage sensing unit 12 for detecting a potential difference between the conductor pattern 3 and the conductor pattern 23 and a potential difference between the conductor pattern 23 and the conductor pattern 5, and a deterioration detection unit 13 for detecting deterioration of the bonding wire 9.

The bonding wire 9 connects the surface electrode 8 and the conductor pattern 23. The bonding wire 22 connects the conductor pattern 23 and the conductor pattern 5.

Figure 6:
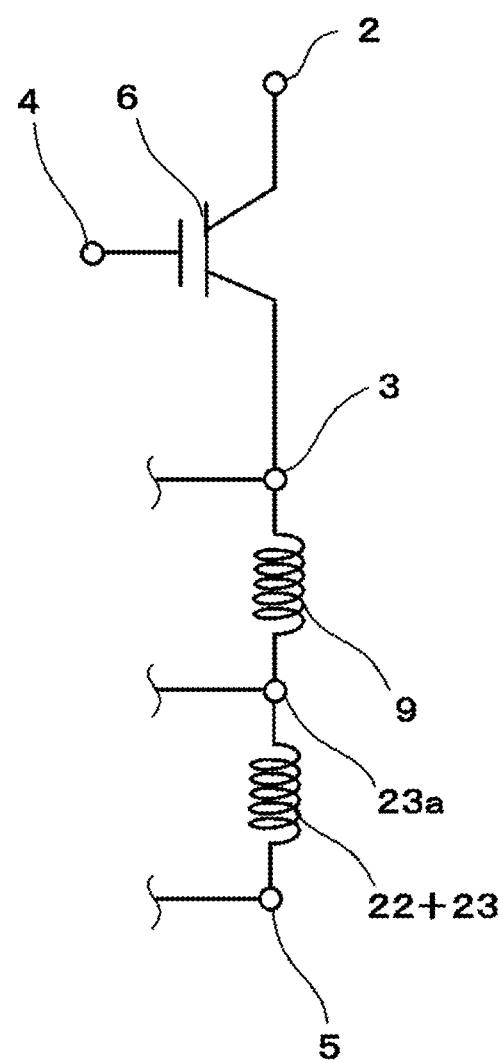
FIG. 6 is a circuit diagram of the semiconductor device according to Embodiment 4 of the present disclosure.

FIG. 6 is a circuit diagram of the semiconductor device according to Embodiment 4 of the present disclosure. FIG. 6 shows a circuit diagram which is a possible embodiment of a circuit on the insulating substrate 1. As shown in FIG. 6, the bonding wire 9 and the bonding wire 22 are connected in series via the conductor pattern 23. The connecting parts of the conductor patterns 3 and 5 as well as the connecting point 23a of the conductor pattern 23 are each connected to the voltage sensing unit 12. This configuration includes the inductances of the bonding wire 9, the conductor pattern 23, and the bonding wire 22.

Referring to FIG. 5, a procedure of the voltage sensing and the deterioration detection at the time of the semiconductor die 6 device's switching off is described.

First, when the semiconductor die 6 device is in its ON state, the current flows from the conductor pattern 2 to the conductor pattern 5 through the semiconductor die 6 device, the surface electrode 8, the bonding wires 9, the conductor pattern 23, and the bonding wires 22 in this order. At the moment the semiconductor die 6 device is switching off like Embodiment 1, a potential difference is induced between the conductor pattern 3 and the conductor pattern 5 not only by the inductance of the bonding wires 9 but also by the inductances of the conductor pattern 23 and the bonding wires 22.

As shown in FIGS. 5 and 6, the voltage sensing unit 12 senses (monitors) two potential difference, one of which is the potential difference between the conductor pattern 3 and the connecting part of the conductor pattern 23, which is its side near to the semiconductor die 6 device, with the bonding wires 9, and the other of which is the potential difference between the conductor pattern 5 and the connecting part of the conductor pattern 23 with the bonding wires 9.

The potential difference between the conductor pattern 3 and the connecting part of the conductor pattern 23 with the bonding wires 9 is represented by the product of the inductance of the bonding wires 9 and the time derivative of the current. The potential difference between the conductor pattern 5 and the connecting part of the conductor pattern 23 with the bonding wires 9 is represented by the product of the sum of the inductance of the conductor pattern 23 and the bonding wires 22 and the time derivative of the current.

Then, by calculating the ratio of the potential difference between the conductor pattern 3 and the connecting part of the conductor pattern 23 with the bonding wires 9 to the potential difference between the conductor pattern 5 and the connecting part of the conductor pattern 23 with the bonding wires 9, it is possible to calculate the ratio of the inductance of the bonding wires 9 to the sum of the inductances of the conductor pattern 23 and the bonding wires 22 at the time of the semiconductor die 6 device's switching off regardless of the time derivative of the current.

Since only the semiconductor die 6 devices and its surrounding components are subjected to large temperature changes in semiconductor devices in general, the conductor pattern 23 and the bonding wires 22, which are separated away from the semiconductor die 6 device, hardly deteriorate, and hence their inductances do not change. Then, the ratio of the inductance of the bonding wires 9 to the sum of the inductances of the conductor pattern 23 and the bonding wires 22 changes monotonously by the deterioration of a bonding wire 9, which makes it possible to detect the deterioration of the bonding wire 9 by this value. The same result can be obtained in case a plurality of set of components with the configuration according to Embodiment 4 are connected in parallel as shown in Embodiment 2.

Since the potential difference between the conductor pattern 3 and the connecting part of the conductor pattern 23 with the bonding wires 9 and a potential difference between the conductor pattern 5 and the connecting part of the conductor pattern 23 with the bonding wires 9 at the time of switching of the semiconductor die 6 device are sensed by the voltage sensing unit 12 connected to the conductor pattern 3, the conductor pattern 5, and the conductor pattern 23 in the semiconductor device 400 with above described configuration, the detection accuracy of the deterioration of the bonding wire 9 can be improved. This is a use of the fact that when the magnitude of the current flowing through an object changes with time, the potential difference between both ends of the object is represented by the product of the time derivative of the current and the inductance of the object.

Since there is no need to increase the current in this configuration, it is possible to keep the temperature rise of the semiconductor die 6 device due to the heat generation in the semiconductor die 6 device small.

Embodiment 5

Embodiment 5 is the application of the semiconductor device according to Embodiments 1 to 4 to a power converter. Although the present embodiment is not limited to a specific power converter, a case where one or more of Embodiment 1 to 4 are applied to a three-phase inverter is described below as Embodiment 5.

Figure 7:
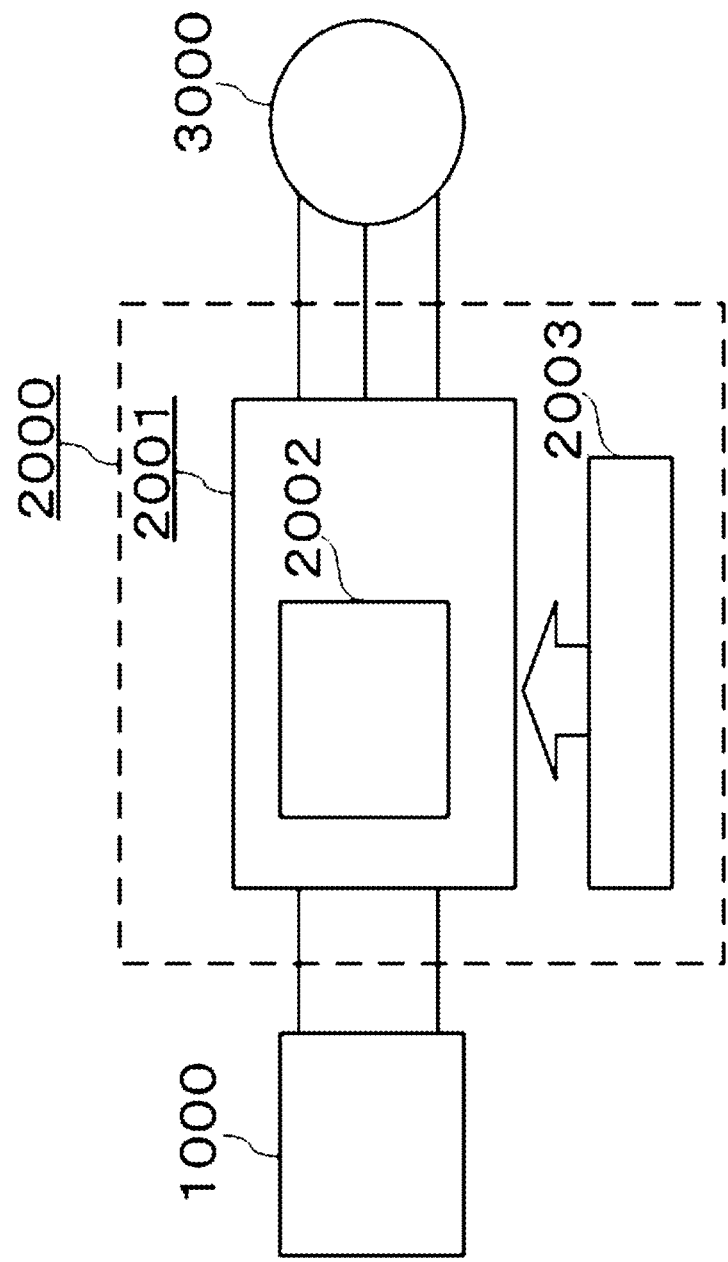
FIG. 7 is a block diagram showing a configuration of a power conversion system to which a power converter according to Embodiment 5 of the present disclosure is applied.

FIG. 7 is a block diagram showing a configuration of a power conversion system to which a power converter according to Embodiment 5 of the present disclosure is applied.

The power conversion system shown in FIG. 7 includes a power supply 1000, a power converter 2000, and a load 3000. The power supply 1000 is a DC power source and supplies DC electricity to the power converter 2000. There are variety of possible power supplies 1000, such as a commercial DC source, a solar cell, and a storage battery, or such as a rectifier circuit, an AC/DC converter, etc. connected to the commercial AC source. It is also possible to use, for the power supply 1000, a DC/DC converter, which is to convert DC electricity which is the output of a commercial DC source into desired electricity.

The power converter 2000 is a three-phase inverter disposed between the power supply 1000 and the load 3000 connected thereto. It converts DC electricity supplied from the power supply 1000 into AC electricity, which is supplied to the load 3000. As shown in FIG. 7, the power converter 2000 includes a main conversion circuit 2001 to convert DC electricity which is the input from the power supply 1000 into AC electricity to be sent out, and a control circuit 2003 to send control signals to control the main conversion circuit 2001 to the main conversion circuit 2001.

The load 3000 is a three-phase electric motor driven by AC electricity supplied from the power converter 2000. The load 3000 is not limited to that for a specific application, but possibly includes electric motors equipped for various electric apparatuses such as a hybrid vehicle, an electric vehicle, a railway car, an elevator, and an air conditioning system.

The details of the power converter 2000 is described below. The main conversion circuit 2001 includes a switching device and a flyback diode (not shown) built in a semiconductor device 2002, and it converts the DC electricity supplied from the power supply 1000 into AC electricity, which is to be supplied to the load 3000, by its switching device's switching.

Although there are a variety of possible actual circuit configurations for the main conversion circuit 2001, the main conversion circuit 2001 to be described in the present embodiment is a two-level three-phase full-bridge circuit, which is possibly constituted by six switching devices and six flyback diodes, each of which is connected in antiparallel to their corresponding switching device. The main conversion circuit 2001 includes semiconductor devices 2002 each of which corresponds to one of the semiconductor devices 2002 according to the above-described Embodiments 1 to 4 and includes, inside them, their own switching device with its corresponding flyback diode, etc. Every two of the six switching devices are mutually connected in series to constitute a unit arm assembly of an upper arm and a lower arm, and each upper-and-lower-arm unit corresponds to phases (U-phase, V-phase, W-phase) of the full-bridge circuit one by one. Output terminals of the upper-and-lower-arm units, i.e., three output terminals of the main conversion circuit 2001, are connected to the load 3000.

The main conversion circuit 2001 also includes driver electronics (not shown) to drive switching devices. The driver electronics may be built in the semiconductor device 2002 or may be provided separately from the semiconductor device 2002. The driver electronics generate drive signals to drive the switching devices in the main conversion circuit 2001 and supplies them to control electrodes of the switching devices in the main conversion circuit 2001. Specifically, following the control signals from the control circuit 2003 to be described later, the driver electronics send drive signals for switching on the switching devices and drive signals for switching off the switching devices to the control electrodes of each individual switching device. In order for a switching device to be kept in its ON state, the drive signal should be a voltage signal (ON signal) whose voltage is equal to or higher than the threshold voltage of the switching device. In order for a switching device to be kept in its OFF state, the drive signal should be a voltage signal (OFF signal) whose voltage is lower than the threshold voltage of the switching device.

The control circuit 2003 controls the switching devices of the main conversion circuit 2001 so that the desired electricity may be supplied to the load 3000. Specifically, it calculates the time durations (ON time) during which each switching device of the main conversion circuit 2001 is to be kept in their ON state based on the electricity to be supplied to the load 3000, which means it may control the main conversion circuit 2001 by PWM control, which is a way of the control to modulate ON time durations of a switching device according to the required output voltage. The control circuit 2003 also sends control command (control signal) outputs to the driver electronics equipped for the main conversion circuit 2001 in order for the ON signals to be sent to the switching devices which are ought to be in their ON state and for the OFF signals to be sent to the switching devices which are ought to be in their OFF state at each specific point in time. The driver electronics send ON signal or OFF signal outputs as drive signals to the control electrodes of individual switching device following the control signals.

Since the semiconductor devices according to Embodiments 1 to 4 are applied, as the semiconductor devices 2002 of the main conversion circuit 2001, to the power converter according to Embodiment 5 with the above described configuration, the reliability can be improved.

Although a case where the present disclosure is applied to a two-level three-phase inverter is represented in the present embodiment, the present disclosure is not limited this. It can be applied to various power converters. For example, a power converter may be a three-level or multi-level power converter, though the two-level one is represented in the present embodiment. The present disclosure may also be applied to a single-phase inverter in case of supplying electricity to a single-phase load. It is also possible for the present disclosure to be applied to a DC/DC converter, an AC/DC converter, etc. in case of supplying electricity to a DC load, or the like.

In addition, the use of the power converter to which the present disclosure is applied is not limited to the case where the load is an electric motor as described above. It possibly is used as a power supply etc for an electric discharge machine, a laser processing machine, an induction heating cooker, a wireless power transfer system, for example. It also possibly is used as a power conditioner for a photovoltaics system, a power storage system, or the like.

Each of the embodiments described above should be understood to be only an example and not a limitation in all respects. The scope of the present disclosure is not limited to the above described embodiments, but is represented by the claims, and includes all the modifications which is equivalent in meanings to and within the scope of the claims. It is also possible to form an embodiment within the scope of the present disclosure by making an optional combination of a plurality of components disclosed in the above embodiments.

LIST OF REFERENCE SIGNS

1: insulating substrate 2, 3, 3a, 3b, 4, 4a, 4b, 5, 23: conductor pattern 6, 20: semiconductor die 7, 7a, 7b: gate electrode 8, 8a, 8b, 21: surface electrode 9, 9a, 9b, 10, 10a, 10b, 11, 11a, 11b, 22: bonding wire 12: voltage sensing unit 13: deterioration detection unit 14: deterioration detection device 15: diode 16: capacitor 17: switch 18: comparator 19: reference voltage generator 23a: connecting point 100, 200, 300, 400, 410, 500, 600, 2002: semiconductor device 1000: power supply 2000: power converter 2001: main conversion circuit 2003: control circuit 3000: load

The invention claimed is:
1. A semiconductor device comprising:
an insulating substrate;
a semiconductor die device attached on the insulating substrate and having a surface electrode on the top side thereof;
a first conductor pattern formed on the insulating substrate, the main current of the semiconductor die device flowing through the first conductor pattern;
a second conductor pattern formed on the insulating substrate to sense the potential of the surface electrode of the semiconductor die device;
a first bonding wire to connect the surface electrode and the first conductor pattern;
a second bonding wire to connect the surface electrode and the second conductor pattern;
a voltage sensor which is connected to the first conductor pattern and the second conductor pattern to sense a potential difference between the first conductor pattern and the second conductor pattern at the time of switching of the semiconductor die device; and a deterioration detector to detect deterioration of the first bonding wire by using the sensed potential difference.

2. The semiconductor device according to claim 1, wherein the voltage sensor senses the potential difference due to an inductance of the first bonding wire.

3. The semiconductor device according to claim 2, wherein the deterioration detector includes a reference voltage generator and a comparator, the comparator comparing the potential difference with a reference voltage generated by the reference voltage generator, the deterioration detector sending an error signal output when the potential difference exceeds the reference voltage.

4. The semiconductor device according to claim 3, wherein the semiconductor device includes a plurality of the semiconductor die devices, the plurality of semiconductor die devices being connected in parallel to the first conductor pattern.

5. The semiconductor device according to claim 3, wherein the semiconductor device includes a plurality of the semiconductor die devices, at least two of the plurality of semiconductor die devices and the first conductor pattern being connected in series.

6. The semiconductor device according to claim 3, wherein
the surface electrode and the first conductor pattern are connected via a third conductor pattern to which the first bonding wire and a third bonding wire are connected, and
the voltage sensor senses a potential difference between the first conductor pattern and the third conductor pattern and a potential difference between the second conductor pattern and the third conductor pattern.

7. A power converter comprising:
a main conversion circuit comprising the semiconductor device according to claim 3 to convert input electricity and sends the converted electricity output; and
a control circuit to send a control signal output to control the main conversion circuit to the main conversion circuit.

8. The semiconductor device according to claim 2, wherein the semiconductor device includes a plurality of the semiconductor die devices, the plurality of semiconductor die devices being connected in parallel to the first conductor pattern.

9. The semiconductor device according to claim 8, wherein
the surface electrode and the first conductor pattern are connected via a third conductor pattern to which the first bonding wire and a third bonding wire are connected, and
the voltage sensor senses a potential difference between the first conductor pattern and the third conductor pattern and a potential difference between the second conductor pattern and the third conductor pattern.

10. The semiconductor device according to claim 2, wherein the semiconductor device includes a plurality of the semiconductor die devices, at least two of the plurality of semiconductor die devices and the first conductor pattern being connected in series.

11. The semiconductor device according to claim 10, wherein
the surface electrode and the first conductor pattern are connected via a third conductor pattern to which the first bonding wire and a third bonding wire are connected, and
the voltage sensor senses a potential difference between the first conductor pattern and the third conductor pattern and a potential difference between the second conductor pattern and the third conductor pattern.

12. The semiconductor device according to claim 2, wherein the semiconductor device includes a plurality of the semiconductor die devices, at least two of the plurality of semiconductor die devices and the first conductor pattern being connected in series.

13. The semiconductor device according to claim 2, wherein
the surface electrode and the first conductor pattern are connected via a third conductor pattern to which the first bonding wire and a third bonding wire are connected, and
the voltage sensor senses a potential difference between the first conductor pattern and the third conductor pattern and a potential difference between the second conductor pattern and the third conductor pattern.

14. A power converter comprising:
a main conversion circuit comprising the semiconductor device according to claim 2 to convert input electricity and sends the converted electricity output; and
a control circuit to send a control signal output to control the main conversion circuit to the main conversion circuit.

15. The semiconductor device according to claim 1, wherein the deterioration detector includes a reference voltage generator and a comparator, the comparator comparing the potential difference with a reference voltage generated by the reference voltage generator, the deterioration detector sending an error signal output when the potential difference exceeds the reference voltage.

16. The semiconductor device according to claim 15, wherein the semiconductor device includes a plurality of the semiconductor die devices, the plurality of semiconductor die devices being connected in parallel to the first conductor pattern.

17. The semiconductor device according to claim 1, wherein the semiconductor device includes a plurality of the semiconductor die devices, the plurality of semiconductor die devices being connected in parallel to the first conductor pattern.

18. The semiconductor device according to claim 1, wherein the semiconductor device includes a plurality of the semiconductor die devices, at least two of the plurality of semiconductor die devices and the first conductor pattern being connected in series.

19. The semiconductor device according to claim 1, wherein
the surface electrode and the first conductor pattern are connected via a third conductor pattern to which the first bonding wire and a third bonding wire are connected, and
the voltage sensor senses a potential difference between the first conductor pattern and the third conductor pattern and a potential difference between the second conductor pattern and the third conductor pattern.

20. A power converter comprising:
a main conversion circuit comprising the semiconductor device according to claim 1 to convert input electricity and sends the converted electricity output; and
a control circuit to send a control signal output to control the main conversion circuit to the main conversion circuit.

* * * * *